United States Patent
Fujita

(10) Patent No.: US 9,461,620 B2
(45) Date of Patent: Oct. 4, 2016

(54) ELASTIC WAVE SPLITTER HAVING A RESONANT CIRCUIT BETWEEN AN ANTENNA TERMINAL AND GROUND

(71) Applicant: Murata Manufacturing Co., Ltd., Nagaokakyo-shi, Kyoto-fu (JP)

(72) Inventor: Shigeyuki Fujita, Nagaokakyo (JP)

(73) Assignee: MURATA MANUFACTURING CO., LTD., Kyoto (JP)

( * ) Notice: Subject to any disclaimer, the term of this patent is extended or adjusted under 35 U.S.C. 154(b) by 220 days.

(21) Appl. No.: 14/246,180

(22) Filed: Apr. 7, 2014

(65) Prior Publication Data
US 2014/0218128 A1 Aug. 7, 2014

Related U.S. Application Data

(63) Continuation of application No. PCT/JP2012/072570, filed on Sep. 5, 2012.

(30) Foreign Application Priority Data

Oct. 24, 2011 (JP) ................................. 2011-233138

(51) Int. Cl.
*H03H 9/72* (2006.01)
*H03H 9/64* (2006.01)
*H03H 7/46* (2006.01)
(Continued)

(52) U.S. Cl.
CPC ............. *H03H 9/725* (2013.01); *H03H 7/461* (2013.01); *H03H 9/6489* (2013.01); *H03H 9/0004* (2013.01); *H03H 9/0576* (2013.01); *H03H 9/6483* (2013.01)

(58) Field of Classification Search
CPC ............. H03H 9/0004; H03H 9/0566; H03H 9/0571; H03H 9/0576; H03H 9/542; H03H 9/547; H03H 9/6409; H03H 9/6423; H03H 9/6483; H03H 9/706; H03H 9/725; H03H 7/461; H03H 9/6489

USPC ........................................................ 333/133
See application file for complete search history.

(56) References Cited

U.S. PATENT DOCUMENTS

| | | | | |
|---|---|---|---|---|
| 6,714,099 B2 * | 3/2004 | Hikita | .................. | H03H 9/0028 333/133 |
| 7,286,028 B2 * | 10/2007 | Kushitani | ............ | H03H 9/6483 310/313 B |

(Continued)

FOREIGN PATENT DOCUMENTS

| | | |
|---|---|---|
| JP | 09-167937 A | 6/1997 |
| JP | 2003-218669 A | 7/2003 |

(Continued)

OTHER PUBLICATIONS

Official Communication issued in corresponding Chinese Patent Application No. 2012800521173, mailed on Aug. 26, 2015.

(Continued)

Primary Examiner — Barbara Summons
(74) Attorney, Agent, or Firm — Keating & Bennett, LLP

(57) ABSTRACT

An elastic wave splitter includes an antenna terminal, a transmission terminal and reception terminals. A transmission filter is connected between the antenna terminal and the transmission terminal. A reception filter is connected between the antenna terminal and the reception terminals. The transmission filter and the reception filter are each defined by an elastic wave filter. A resonant circuit is connected between the antenna terminal and a ground potential. The resonant circuit includes a surface acoustic wave resonator and a capacitor connected in series with the surface acoustic wave resonator. A resonant frequency of the resonant circuit is positioned in a frequency band of an interference wave that causes intermodulation distortion to be generated.

20 Claims, 8 Drawing Sheets

(51) Int. Cl.
*H03H 9/05* (2006.01)
*H03H 9/00* (2006.01)

(56) References Cited

U.S. PATENT DOCUMENTS

| | | | | |
|---|---|---|---|---|
| 7,800,461 | B2 * | 9/2010 | Terada | H03H 9/725 |
| | | | | 333/133 |
| 7,876,178 | B2 * | 1/2011 | Tamura | H03H 9/0576 |
| | | | | 333/133 |
| 2007/0046395 | A1 * | 3/2007 | Tsutsumi | H03H 9/0571 |
| | | | | 333/133 |
| 2008/0068109 | A1 * | 3/2008 | Schmidhammer | H04B 1/50 |
| | | | | 333/133 |
| 2010/0109801 | A1 | 5/2010 | Inoue et al. | |

FOREIGN PATENT DOCUMENTS

| | | | |
|---|---|---|---|
| JP | 2010-021914 A | | 1/2010 |
| JP | 2010-109894 A | | 5/2010 |
| JP | 2010-206375 | * | 9/2010 |
| JP | 2011-193080 A | | 9/2011 |

OTHER PUBLICATIONS

Official Communication issued in corresponding European Patent Application No. 12843590.6, mailed on Jun. 10, 2015.
Official Communication issued in International Patent Application No. PCT/JP2012/072570, mailed on Nov. 27, 2012.

* cited by examiner

ELASTIC WAVE SPLITTER HAVING A RESONANT CIRCUIT BETWEEN AN ANTENNA TERMINAL AND GROUND

BACKGROUND OF THE INVENTION

1. Field of the Invention

The present invention relates to splitters that use elastic waves such as surface acoustic waves, boundary acoustic waves or bulk elastic waves, and in particular relates to elastic wave splitters that include a transmission filter and a reception filter defined by elastic wave filters.

2. Description of the Related Art

In recent years, splitters using elastic wave resonator filters have been widely used as splitters in communication devices. Examples of such an elastic wave resonator include a bulk elastic wave resonator filter, a surface acoustic wave resonator filter and a boundary acoustic wave resonator filter.

In such elastic wave resonator filters, intermodulation distortion (IMD) is generated due to the nonlinearity of the filters. In addition, degradation of filter characteristics is a problem.

In Japanese Unexamined Patent Application Publication No. 2010-21914, a splitter is disclosed having a configuration in which generation of intermodulation distortion is suppressed. FIG. 15 is a circuit diagram of the splitter described in Japanese Unexamined Patent Application Publication No. 2010-21914.

An antenna terminal 1003 of a splitter 1001 is connected to an antenna 1002. A transmission filter 1004 and a reception filter 1005 are connected to the antenna terminal 1003. The transmission filter 1004 is a ladder filter composed of a plurality of BAW resonators. In addition, the reception filter 1005 is a balanced filter. An input terminal 1005a of the reception filter 1005 is connected to the antenna terminal 1003 and output terminals of the reception filter 1005 are a pair of balanced reception terminals 1005b and 1005c. A first longitudinally-coupled-type SAW resonator filter 1006 is connected between the input terminal 1005a and the reception terminal 1005b, and a second longitudinally-coupled-type SAW resonator filter 1007 is connected between the input terminal 1005a and the reception terminal 1005c.

In order to achieve impedance matching between the reception filter 1005 and the transmission filter 1004, an inductance L1 is connected between the antenna terminal 1003 and a ground potential and an inductance L2 is connected between the antenna terminal 1003 and the transmission filter 1004. In addition, in the transmission filter 1004, first and second resonators 1011 and 1012, which are serially divided into two, are connected in series with each other on the antenna terminal side. In addition, in the reception filter 1005, SAW resonators 1021 and 1022 and SAW resonators 1031 and 1032, which are serially divided into two, are arranged on the input terminal 1005a side. That is, in each of the transmission filter 1004 and the reception filter 1005, the resonator on the antenna terminal side is composed of two resonators, which are connected in series with each other. In such a case, the area of the resonator is increased approximately fourfold, as a result of the resonator being serially divided into two, without the impedance of the resonator changing. Consequently, the power density per unit area is reduced to ¼ and non-linear distortion of the resonator can be reduced. Therefore, intermodulation distortion in the splitter can be suppressed.

However, in the splitter 1001 described in Japanese Unexamined Patent Application Publication No. 2010-21914, the areas of the resonators are increased and therefore it is difficult to reduce the size of the splitter 1001. In addition, resistive loss is increased and therefore, there has been a problem in that insertion loss is increased.

SUMMARY OF THE INVENTION

Preferred embodiments of the present invention provide an elastic wave splitter that significantly reduces or prevents generation of intermodulation distortion while not incurring an increase in size or degradation of insertion loss.

An elastic wave splitter according to a preferred embodiment of the present invention includes an antenna terminal, a transmission terminal and a reception terminal. The elastic wave splitter according to a preferred embodiment of the present invention includes a transmission filter that is connected between the antenna terminal and the transmission terminal and is defined by an elastic wave filter, a reception filter that is connected between the antenna terminal and the reception terminal and is defined by an elastic wave filter, and a resonant circuit that is connected between the antenna terminal and a ground potential and includes an elastic wave resonator and a capacitor connected in series with the elastic wave resonator. In a preferred embodiment of the present invention, a resonant frequency of the resonant circuit is positioned in a frequency band of an interference wave that causes intermodulation distortion to be generated.

In a certain specific aspect of the elastic wave splitter according to a preferred embodiment of the present invention, when one of a transmission frequency band of the transmission filter and a reception frequency band of the reception filter is F1 to F2 (F2>F1) and the other is R1 to R2 (R2>R1), the resonant frequency of the resonant circuit preferably is positioned in a band of mF1±nR1~mF2±nR2, where m and n are integers.

In another specific aspect of the elastic wave splitter according to a preferred embodiment of the present invention, the resonant frequency of the resonant circuit preferably is positioned in a band of |mF1±nR1|~|mF2±nR2| (0<|m|+|n|≤7).

In yet another specific aspect of the elastic wave splitter according to a preferred embodiment of the present invention, the resonant frequency of the resonant circuit preferably is positioned in a band of |mF1±nR1|~|mF2±nR2| (0<|m|+|n|≤3).

In another specific aspect of the elastic wave splitter according to a preferred embodiment of the present invention, the resonant circuit preferably further includes a second elastic wave resonator connected in parallel with the elastic wave resonator. In this case, two attenuation poles are positioned in the interference wave frequency band by making a resonant frequency of the second elastic wave resonator be different from the resonant frequency of the first elastic wave resonator. Therefore, interference waves are attenuated over a broader frequency band.

In another specific aspect of the elastic wave splitter according to a preferred embodiment of the present invention, the resonant circuit further preferably includes a third elastic wave resonator connected in series with the elastic wave resonator. In this case as well, two attenuation poles are positioned in the interference wave frequency band by serially connecting the third elastic wave resonator, which has a different IDT electrode wavelength. Therefore, interference waves are attenuated over a broader frequency band.

In yet another specific aspect of the elastic wave splitter according to a preferred embodiment of the present invention, the transmission filter preferably is defined by a transmission filter chip that includes a piezoelectric substrate, the reception filter preferably is defined by a reception filter chip that includes a piezoelectric substrate, and the resonant circuit preferably includes one of the transmission filter chip and the reception filter chip.

In still yet another specific aspect of the elastic wave splitter according to a preferred embodiment of the present invention, the transmission filter chip and the reception filter chip preferably are formed in an integrated manner using a single piezoelectric substrate, and the resonant circuit is provided on the piezoelectric substrate. Therefore, a further decrease in size is achieved.

In still yet another specific aspect of the elastic wave splitter according to a preferred embodiment of the present invention, a wiring board preferably is further included, the transmission filter chip and the reception filter chip being mounted on the wiring board. In this case, the elastic wave splitter is provided as a standalone chip component.

With the elastic wave splitter according to various preferred embodiments of the present invention, interference waves causing intermodulation distortion are attenuated with certainty as a result of a resonant circuit, which includes an elastic wave resonator and a capacitor connected in series with the elastic wave resonator, being provided between an antenna terminal and the ground potential and the resonant frequency of the resonant circuit being positioned in a frequency band of the interference waves that cause the generation of intermodulation distortion. Therefore, the frequency characteristics of the splitter are significantly improved. Moreover, since interference waves are attenuated by the resonant circuit, it is not likely that an increase in the size of the elastic wave splitter or degradation of insertion loss due to an increase in resistive loss will be incurred.

The above and other elements, features, steps, characteristics and advantages of the present invention will become more apparent from the following detailed description of the preferred embodiments with reference to the attached drawings.

DETAILED DESCRIPTION OF THE PREFERRED EMBODIMENTS

Figure 1:
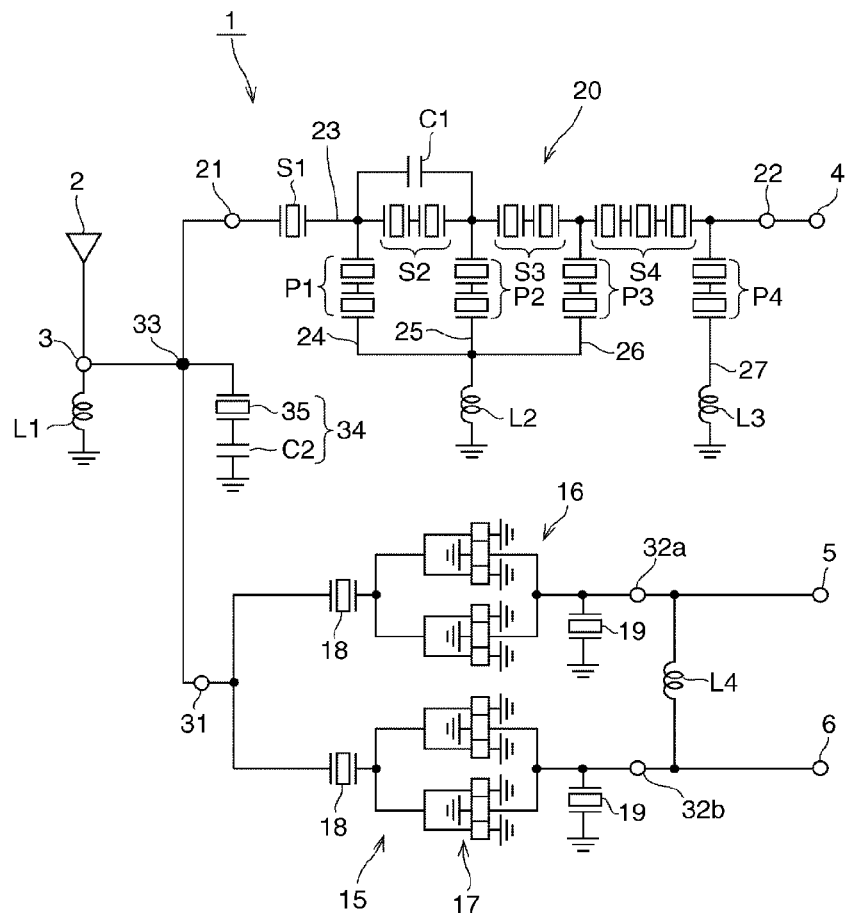
FIG. 1 is a circuit diagram of an elastic wave splitter according to a first preferred embodiment of the present invention.

Hereafter, the present invention will be made clear by describing specific preferred embodiments of the present invention while referring to the drawings.

FIG. 1 is a schematic circuit diagram of an elastic wave splitter according to a first preferred embodiment of the present invention. The elastic wave splitter according to this preferred embodiment preferably uses surface acoustic waves as elastic waves. In addition, an elastic wave splitter 1 preferably is a surface acoustic wave duplexer used in UMTS BAND 2. In BAND 2, a transmission frequency band is 1850 MHz to 1910 MHz and a reception frequency band is 1930 MHz to 1990 MHz.

The elastic wave splitter 1 preferably includes an antenna terminal 3 that is connected to an antenna 2. The elastic wave splitter 1 has the antenna terminal 3, a transmission terminal 4 and reception terminals 5 and 6 as external terminals.

A transmission filter 20 including a surface acoustic wave filter having a ladder circuit configuration is connected between the antenna terminal 3 and the transmission terminal 4. In addition, a reception filter 15 is connected between the antenna terminal 3 and the reception terminals 5 and 6. The reception filter 15 preferably includes a longitudinally coupled type surface acoustic wave resonator filter.

An external matching inductor L1 is connected between a connection point between the antenna 2 and the antenna terminal 3, and a ground potential.

The transmission filter 20 includes an output terminal 21 connected to the antenna terminal 3 and an input terminal 22 connected to the transmission terminal 4. The output terminal 21 and the input terminal 22 are connected to each other by a series arm 23.

In the series arm 23, a plurality of series arm resonators S1 to S4 are connected in series with each other. The series arm resonators S1 to S4 are preferably defined by single-terminal-pair surface acoustic wave resonators. In FIG. 1, the series arm resonators S2 to S4 each have a structure in which a plurality of single-terminal-pair surface acoustic wave resonators are connected in series with each other. In addition, a capacitor C1 is connected in parallel with the series arm resonator S2. Alternatively, the series arm resonators S2 to S4 may instead be defined by a single series arm resonator, similarly to the series arm resonator S1.

A plurality of parallel arms 24 to 27 are provided between the series arm 23 and the ground potential. In the parallel arms 24 to 27, parallel arm resonators P1 to P4 defined by single-terminal-pair surface acoustic wave resonators are respectively provided. The parallel arm resonators P1 to P4 each have a structure in which two single-terminal-pair surface acoustic wave resonators are connected in series with each other, but may be instead each defined by just one single-terminal-pair surface acoustic wave resonator.

An inductor L2 is connected between a connection point at which the parallel arms 24 to 26 are connected to one another on the ground potential side, and the ground potential. In addition, an inductor L3 is connected in series with the parallel arm resonator P4 in the parallel arm 27.

The reception filter 15 is a balanced surface acoustic wave filter having a balanced-unbalanced transforming function. The reception filter 15 includes an unbalanced input terminal 31 connected to the antenna terminal 3 and balanced output terminals 32a and 32b respectively connected to the reception terminals 5 and 6. First and second filter sections 16 and 17 are respectively connected between the unbalanced input terminal 31 and the balanced output terminals 32a and 32b. The first and second filter sections 16 and 17 are each defined by first and second longitudinally-coupled-type surface acoustic wave resonator filter devices connected in parallel with each other. The first and second longitudinally-coupled-type surface acoustic wave resonator filter devices each include three IDT electrodes arranged along a surface acoustic wave propagation direction and a pair of reflectors arranged on the two sides of the three IDT electrodes.

Single-terminal-pair surface acoustic wave resonators 18 and 18 are respectively connected between the unbalanced input terminal 31 and input terminals of the first and second filter sections 16 and 17. Single-terminal-pair surface acoustic wave resonators 19 and 19 are respectively connected between output terminals of the first and second filter sections 16 and 17 and the ground potential. An external matching inductor L4 is connected between the balanced output terminals 32a and 32b.

A resonant circuit 34, which is one of the characteristic features of this preferred embodiment, is provided between a connection point 33 between the reception filter 15 and the transmission filter 20, and the ground potential. The resonant circuit 34 preferably includes a single-terminal-pair surface acoustic wave resonator 35 and a capacitor C2, which are connected in series with each other.

Figure 2:
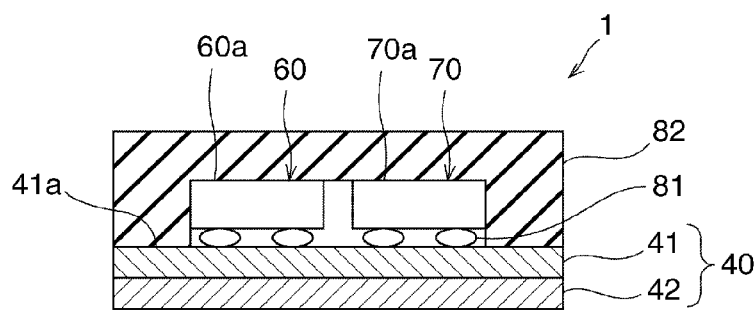
FIG. 2 is a schematic elevational cross-sectional view of the elastic wave splitter according to the first preferred embodiment of the present invention.

FIG. 2 is a schematic elevational cross-sectional view of the elastic wave splitter 1 of this preferred embodiment. As illustrated in FIG. 2, the elastic wave splitter 1 includes a wiring board 40. In this preferred embodiment, the wiring board 40 preferably is defined by a multilayer body including first and second dielectric layers 41 and 42. The first and second dielectric layers 41 and 42 preferably include an appropriate dielectric material such as a ceramic or a resin.

An upper surface of the first dielectric layer 41 defines a die attach surface 41a. A transmission filter chip 60 and a reception filter chip 70 are flip chip mounted via bumps 81 on the die attach surface 41a of the wiring board 40. A sealing resin layer 82 is provided on the die attach surface 41a of the wiring board 40 so as to seal the transmission filter chip 60 and the reception filter chip 70.

The matching inductors L2 and L3, which are illustrated in FIG. 1, are preferably defined by internal wiring lines of the wiring board 40.

The transmission filter chip 60 and the reception filter chip 70 include piezoelectric substrates 60a and 70a. Electrode structures of the above-mentioned transmission filter 20 and reception filter 15 are provided on the lower surfaces of these piezoelectric substrates 60a and 70a. The electrode structures that define the reception filter 15 and the transmission filter 20 can be formed using a well-known electrode forming method of the related art, for example. In this preferred embodiment, the single-terminal-pair surface acoustic wave resonator 35 and the capacitor C2 of the resonant circuit 34 are also provided on the lower surface of the piezoelectric substrate 60a on which the transmission filter 20 is provided. Therefore, the resonant circuit 34 is formed and provided without incurring an increase in size.

Figure 3:
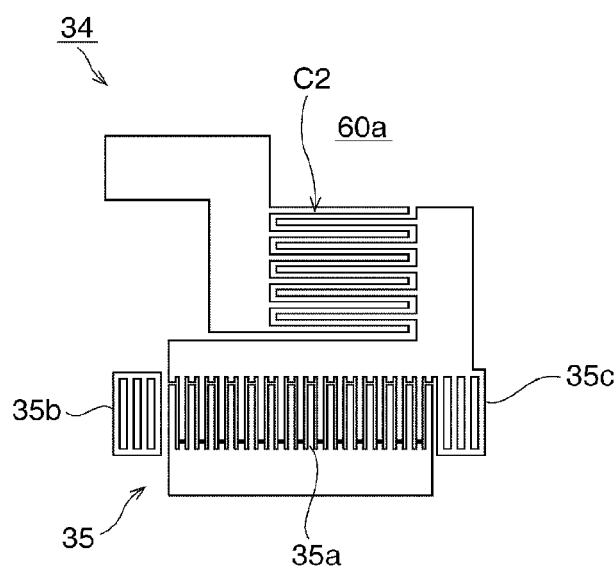
FIG. 3 is a schematic plan view illustrating an electrode structure of a resonant circuit provided in the elastic wave splitter of the first preferred embodiment of the present invention.

FIG. 3 is a schematic plan view illustrating an electrode structure that defines the resonant circuit 34.

As illustrated in FIG. 3, the illustrated electrode structure is provided on the lower surface of the piezoelectric substrate 60a. The single-terminal-pair surface acoustic wave resonator 35 includes an IDT electrode 35a and reflectors 35b and 35c arranged on the two sides of the IDT electrode 35a. The capacitor C2 preferably includes comb-tooth electrodes each including a plurality of electrode fingers that mesh or interdigitate with the electrode fingers of the other electrode. Therefore, the single-terminal-pair surface acoustic wave resonator 35 and the capacitor C2 can be easily formed in the same step as the electrodes that define the series arm resonators S1 to S4 and the parallel arm resonators P1 to P4 that define the transmission filter 20.

In addition, the electrode material of the resonant circuit 34 is not particularly limited, but is preferably the same material as used for the electrodes that define the series arm resonators S1 to S4 and the parallel arm resonators P1 to P4 so that the resonant circuit 34 can be formed in the same step, for example.

Such an electrode material is not particularly limited and for example a metal selected from a group consisting of Al, Pt, Au, Ag, Cu, Ni, Ti, Cr and Pd, or an alloy including at least one of these metals can be used. In addition, the electrodes may be defined by laminates of a plurality of metal layers composed of a metal or alloy as described above.

In this preferred embodiment, in the IDT electrode 35a of the single-terminal-pair surface acoustic wave resonator 35, the wavelength preferably is about 2.1921 μm, the electrode finger intersecting width preferably is about 30 μm and the number of pairs of electrode fingers is 60, for example. In addition, the capacitance value of the comb-tooth electrodes forming the capacitor C2 preferably is about 0.5 pF, for example.

As illustrated in FIG. 3, in this preferred embodiment, the direction in which the electrode fingers of the comb-tooth electrodes of the capacitor C2 extend defines an angle of about 90° with a direction in which the electrode fingers of the IDT electrode 35a extend, for example. Thus, a surface acoustic wave is not likely to be excited in the capacitor C2 defined by the comb-tooth electrodes and the capacitor C2 can sufficiently function as merely a capacitance.

The direction in which the electrode fingers of the comb-tooth electrodes of the capacitor C2 extend is not limited to one that defines an angle of about 90° with the direction in which the electrode fingers of the IDT electrode 35a extend and it is sufficient that it be a direction that is not parallel with but merely intersects that direction. It is preferable that an intersection angle that is less than about 90° among the two angles defined by intersection of the direction in which the electrode fingers of the comb-tooth electrodes extend and the direction in which the electrode fingers of the IDT electrode 35a extend be about 45° or more, for example. As a result, excitation of a surface acoustic wave in the comb-tooth electrodes is effectively reduced or prevented. More preferably, the intersection angle preferably is about 90° as in this preferred embodiment illustrated in FIG. 3.

IMD is generated at frequencies that are the sum of, or the difference between, integer multiples of the frequencies of two signals. Therefore, if a signal having a frequency that is such a sum or difference determined by a combination of a transmission signal and a reception signal, that is, an interference wave signal that causes IMD to be generated in the transmission frequency band or the reception frequency band, is input to the reception filter 15 and the transmission filter 20 from the antenna side, communication quality of the elastic wave splitter 1 is degraded.

However, according to this preferred embodiment, since the resonant circuit 34 is provided, even if an interference wave signal is input to the reception filter 15 and the transmission filter 20, the interference wave signal is sufficiently attenuated. More specifically, in this preferred embodiment, since the elastic wave splitter 1 preferably is a BAND 2 elastic wave splitter, the resonant frequency of the resonant circuit 34 is positioned within a frequency band of (1770 MHz to 1830 MHz) obtained by subtracting the reception frequency band (1930 MHz to 1990 MHz) from twice the transmission frequency band (1850 MHz to 1910 MHz). The 1770 MHz to 1830 MHz band will be referred to as an interference wave frequency band.

In this preferred embodiment, by positioning the resonant frequency of the resonant circuit 34 within the interference wave frequency band, an interference wave signal, which is the cause of IMD, is attenuated. Therefore, IMD is significantly reduced or prevented and the communication quality of the elastic wave splitter 1 is high. This will be explained on the basis of more specific examples.

Figure 4:
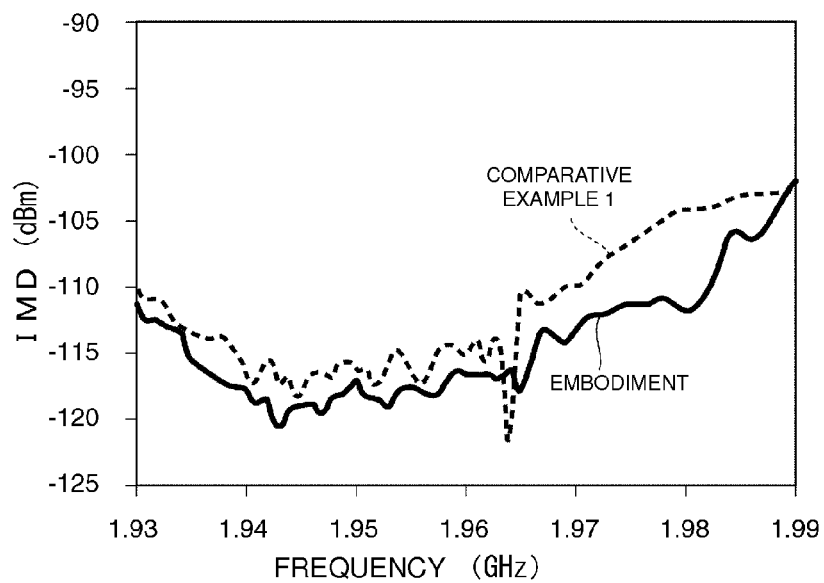
FIG. 4 illustrates an IMD characteristic of the elastic wave splitter of the first preferred embodiment of the present invention and that of a comparative example.
Figure 5:
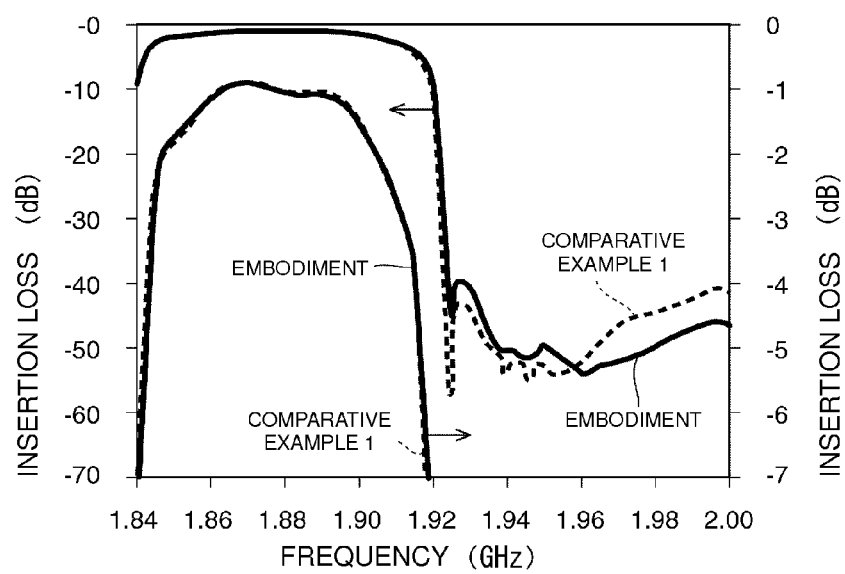
FIG. 5 illustrates a transmission characteristic of a transmission filter of the elastic wave splitter of the first preferred embodiment of the present invention and that of comparative example 1.
Figure 6:
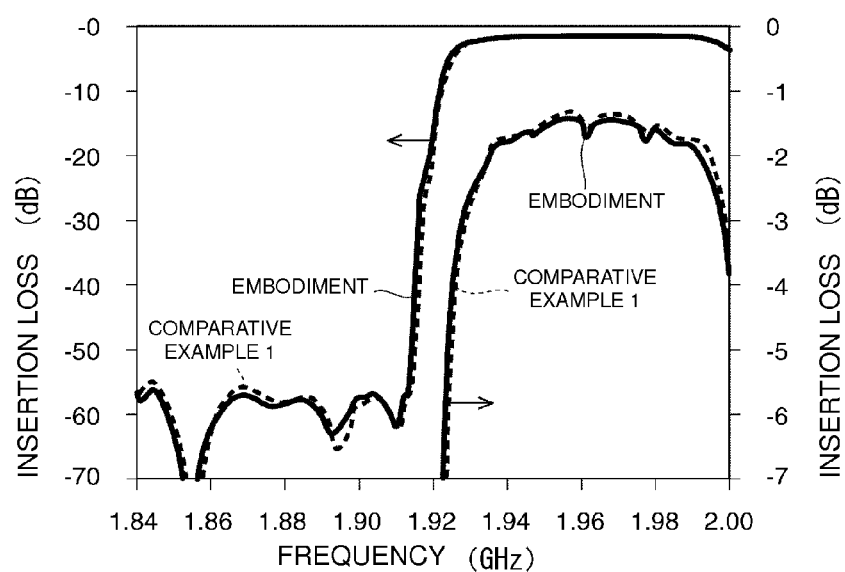
FIG. 6 illustrates a transmission characteristic of a reception filter of the elastic wave splitter of the first preferred embodiment of the present invention and that of comparative example 1.

The elastic wave splitter of the above-described preferred embodiment and an elastic wave splitter of comparative example 1 having the same configuration as that of the above-described preferred embodiment except that the resonant circuit 34 is not provided were prepared. FIG. 4 illustrates the results of measuring the IMD characteristics of the elastic wave splitters of the above-described preferred embodiment and comparative example 1. FIG. 5 illustrates the transmission characteristics of the transmission filters 20 and FIG. 6 illustrates the transmission characteristics of the reception filters 15 in the elastic wave splitters of the above-described preferred embodiment and comparative example 1.

As illustrated in FIG. 4, the IMD characteristic is improved in the preferred embodiment compared with comparative example 1. In addition, as illustrated in FIG. 5, compared with comparative example 1, the attenuation characteristic in the reception frequency band is also improved in the present preferred embodiment without the insertion loss in the passband of the transmission filter being degraded. In addition, as illustrated in FIG. 6, in the present preferred embodiment, it is clear that the insertion loss in the passband of the reception filter is also not degraded compared with comparative example 1.

Figure 7:
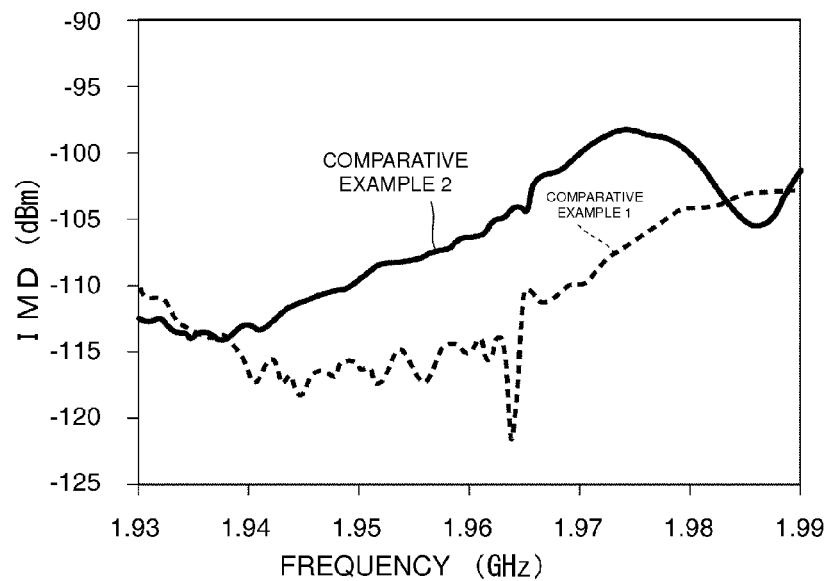
FIG. 7 illustrates an IMD characteristic of the elastic wave splitter of comparative example 1 and that of comparative example 2.
Figure 8:
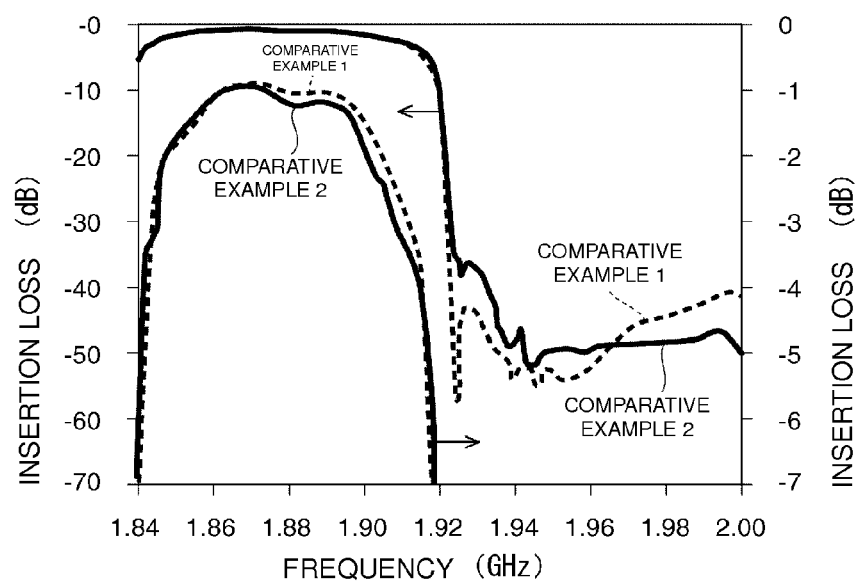
FIG. 8 illustrates a transmission characteristic of a transmission filter of the elastic wave splitter of comparative example 1 and that of comparative example 2.
Figure 9:
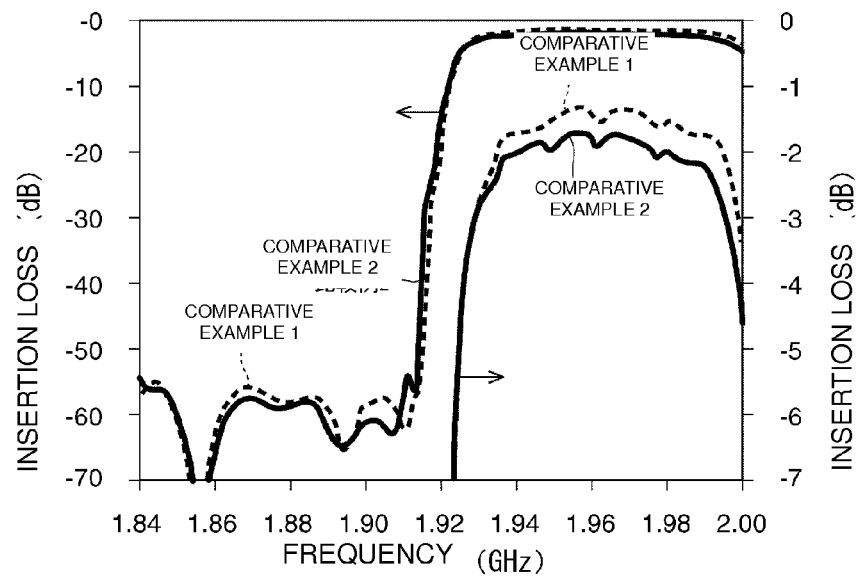
FIG. 9 illustrates a transmission characteristic of the reception filter of the elastic wave splitter of comparative example 1 and that of comparative example 2.

The interference wave signal is attenuated also in the case where only the single-terminal-pair surface acoustic wave resonator 35 is used instead of the resonant circuit 34. However, in reality, unless the capacitor C2 is connected, the IMD characteristic is not improved. This point will be explained while referring to FIGS. 7 to 9. In FIGS. 7 to 9, the characteristics of comparative example 1 and the characteristics of comparative example 2, which is structured similarly to the above-described preferred embodiment except that the capacitor C2 is not provided, are illustrated. That is, in comparative example 2, only the single-terminal-pair surface acoustic wave resonator 35, which defines the resonant circuit 34, is used and the capacitor C2 is not connected. FIG. 7 illustrates the IMD characteristics, FIG. 8 illustrates the transmission characteristics of the transmission filters and FIG. 9 illustrates the transmission characteristics of the reception filters.

As illustrated in FIG. 7, the IMD characteristic is even more degraded in comparative example 2 than in comparative example 1. This is because there is no capacitor C2. Accordingly, it is thought that this further degradation is due to the power density of the single-terminal-pair surface acoustic wave resonator 35 becoming higher and IMD being generated due to non-linear distortion.

In addition, as illustrated in FIG. 8 and FIG. 9, in comparative example 2, the insertion loss in the passband of the reception filter is also degraded and the attenuation characteristic in the reception frequency band of the transmission filter is also degraded compared with comparative example 1.

Figure 10:
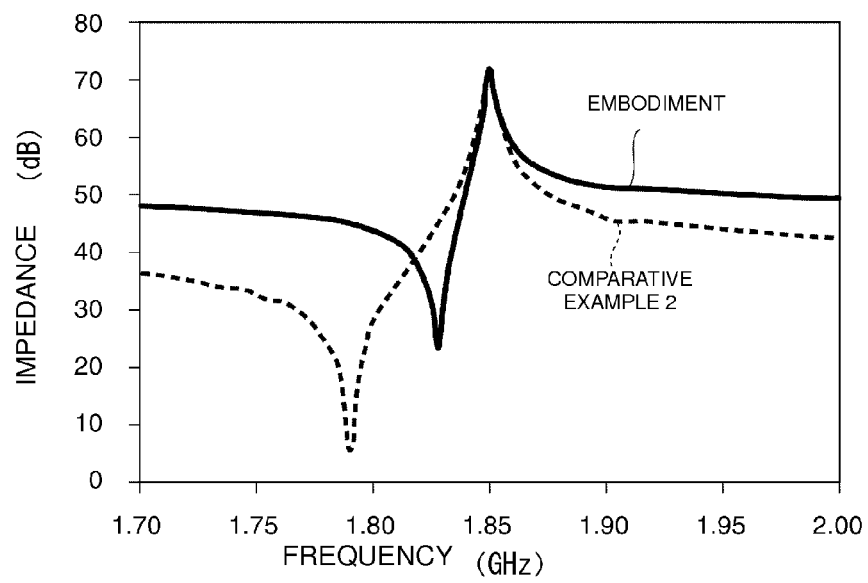
FIG. 10 illustrates an impedance characteristic of a resonant circuit of the first preferred embodiment of the present invention and that of comparative example 2.

FIG. 10 illustrates the impedance characteristic of the resonant circuit 34 used in the first preferred embodiment and the impedance characteristic of the resonant circuit used in comparative example 2. In comparative example 2, compared with the above-described preferred embodiment, the impedance ratio, that is, the ratio of the impedance at the antiresonant frequency to the impedance at the resonant frequency, is larger. This is due to the potential difference being smaller as a result of the capacitor C2 being located between the single-terminal-pair surface acoustic wave resonator 35 and the ground potential in the above-described preferred embodiment. That is, compared with comparative example 2, in the above-described preferred embodiment, it is illustrated that excitation of the single-terminal-pair surface acoustic wave resonator 35 is smaller. Therefore, compared with comparative example 2, according to the above-described preferred embodiment, non-linear distortion of the single-terminal-pair surface acoustic wave resonator 35 itself is significantly reduced and generation of IMD is significantly reduced.

In addition, non-linear distortion of the single-terminal-pair surface acoustic wave resonator 35 is significantly reduced by also inserting an inductor or a resistor between the single-terminal-pair surface acoustic wave resonator 35 and the ground potential. However, if wiring is arranged on the chip in order to define the inductor, the surface area of the chip will become larger compared with the case of the capacitor C2. In addition, the capacitor C2 or the inductor can be formed in the same step as the electrodes that form the series-arm resonators S1 to S4 and the parallel-arm resonators P1 to P4. In contrast, in the case of a resistor, the resistor has to be formed in a separate step. Therefore, it is preferable that the capacitor C2 be provided between the single-terminal-pair surface acoustic wave resonator 35 and the ground potential so that size reduction and manufacturability are effectively increased.

Figure 11:
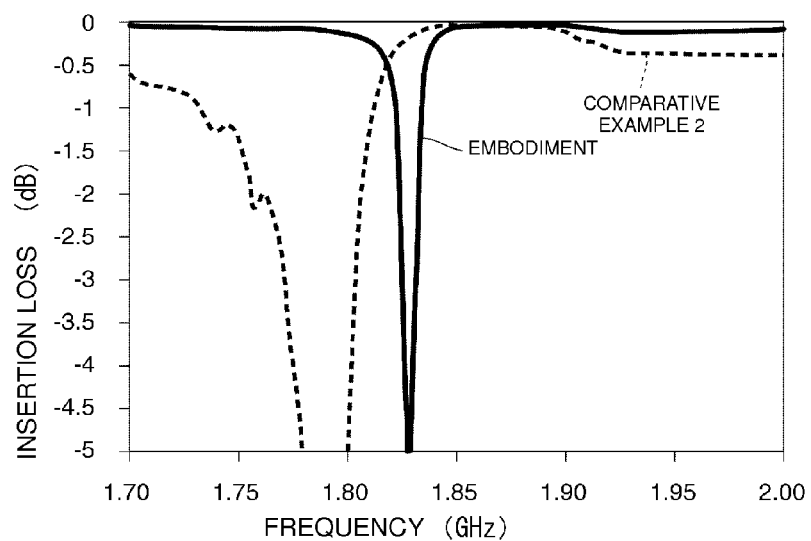
FIG. 11 illustrates the transmission characteristic of a resonant circuit used in the elastic wave splitter of the first preferred embodiment of the present invention and that of comparative example 2.

On the other hand, as illustrated in FIG. 9, insertion loss in the passband of the reception filter is also greatly degraded in comparative example 2 compared with comparative example 1. FIG. 11 illustrates the transmission characteristic of the resonant circuit of the above-described preferred embodiment and the transmission characteristic of the resonant circuit of comparative example 2. In the above-described preferred embodiment, insertion loss is small except for in the vicinity of the resonant frequency. In contrast, in comparative example 2, insertion loss is larger in the reception frequency band (1930 MHz to 1990 MHz). Consequently, it is thought that the insertion loss in the passband of the reception filter 15 of comparative example 2 is degraded, as illustrated in FIG. 9. In addition, as illustrated in FIG. 8, the attenuation characteristic in the reception frequency band of the transmission filter is degraded in comparative example 2 compared with comparative example 1. It is thought that this is because a signal of the reception frequency band leaks from the resonant circuit along the ground wiring line.

As has been described above, in this preferred embodiment, since the resonant circuit 34 includes the capacitor C2, IMD is effectively suppressed without incurring degradation of insertion loss and the attenuation characteristic. In the example of the related art described in Japanese Unexamined Patent Application Publication No. 2010-21914, a resonator positioned on the antenna terminal side is serially divided into two, and as a result the area of the resonator is increased fourfold. In contrast, according to this preferred embodiment, it is sufficient that only the single-terminal-pair surface acoustic wave resonator 35, which has a comparatively small area, and the capacitor C2 be added to the transmission filter 20 side. Moreover, regarding the reception filter 15, it is not necessary to divide the resonators into two and it is also not necessary to add the resonant circuit 34. Accordingly, a substantial decrease in size can be achieved for the elastic wave splitter 1.

In this preferred embodiment, the interference wave frequency band is a frequency band obtained by subtracting the reception frequency band from twice the BAND 2 transmission frequency band, but the interference wave frequency band in the present invention is not limited to this. That is, when one of the transmission frequency band and the reception frequency band is F1 to F2 (here, F2>F1) and the other one is R1 to R2 (here, R2>R1), the frequency band of an interference wave that is the cause of IMD is positioned in a frequency band that is the sum of or the difference between an integer multiple of the one frequency band and an integer multiple of the other frequency band. Therefore, the interference wave frequency band may preferably be positioned within a band of $|mF1 \pm nR1| \sim |mF2 \pm nR2|$, for example. Here, m and n are integers. The interference wave frequency band, which is the cause of IMD, lies in innumerable bands resulting from the combinations of m and n.

In addition, when the number of communication systems used in a communication device is to be increased in the future, it is more preferable that $|mF1 \pm nR1| \sim |mF2 \pm nR2|$ (here, $0<|m|+|n| \leq 7$)), for example. As a result, various preferred embodiments of the present invention can be applied to a greater variety of communication systems.

The signal strengths of higher-order harmonics of the transmission signal and the reception signal are more greatly attenuated. Therefore, it is more preferable that the resonant frequency of the resonant circuit be arranged in a frequency band of $|mF1 \pm nR1| \sim |mF2 \pm nR2|$ (here, $0<|m|+|n| \leq 3$), for example. As a result, the interference waves are more effectively attenuated.

Second Preferred Embodiment

Figure 12:
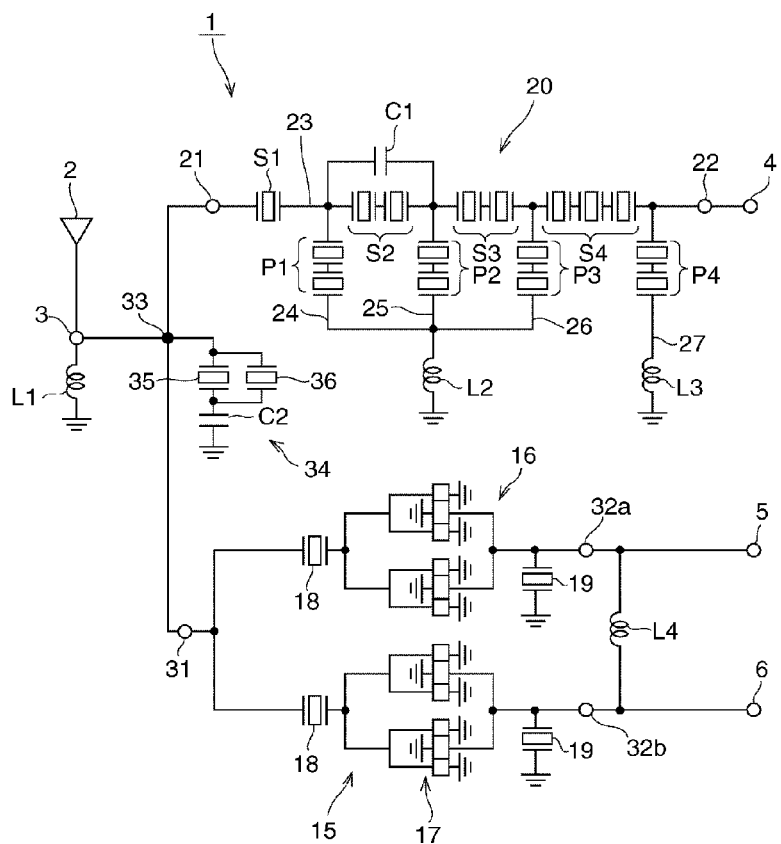
FIG. 12 is a schematic circuit diagram of an elastic wave splitter according to a second preferred embodiment of the present invention.

FIG. 12 is a schematic circuit diagram of an elastic wave splitter according to a second preferred embodiment of the present invention. Elements that are the same as those in the first preferred embodiment are denoted by the same reference symbols, their description in the first preferred embodiment is to be referred to and detailed description thereof will be omitted.

In this preferred embodiment, a second single-terminal-pair surface acoustic wave resonator 36 is connected in parallel with the single-terminal-pair surface acoustic wave resonator 35 in the resonant circuit 34. The wavelength of the IDT electrode in the second single-terminal-pair surface acoustic wave resonator 36 is relatively large compared to that of the first single-terminal-pair surface acoustic wave resonator 35. That is, the resonant frequency of the second single-terminal-pair surface acoustic wave resonator 36 is positioned further toward the low frequency side than the resonant frequency of the first single-terminal-pair surface acoustic wave resonator 35. The rest of the configuration of the second preferred embodiment preferably is the same as that of the first preferred embodiment.

As illustrated in FIG. 11, the stop bandwidth is narrower in the first preferred embodiment than in comparative example 2, in which the capacitor C2 is not provided. In contrast, in this preferred embodiment, the second single-terminal-pair surface acoustic wave resonator 36, in which the wavelength of the IDT electrode is larger than that in the single-terminal-pair surface acoustic wave resonator 35, is used. As a result, two attenuation poles are positioned in the interference wave frequency band. As a result, the stop bandwidth can be made broader. Therefore, according to this preferred embodiment, interference waves are attenuated over a broader frequency band than in the first preferred embodiment.

Figure 13:
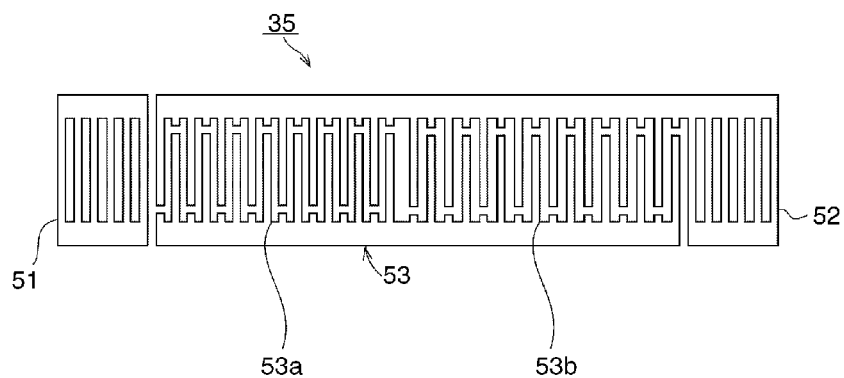
FIG. 13 is a schematic plan view illustrating an electrode structure of a single-terminal-pair surface acoustic wave resonator used to define a resonant circuit in the second preferred embodiment of the present invention.

FIG. 13 illustrates a modification of the single-terminal-pair surface acoustic wave resonator 35 in the elastic wave splitter of the second preferred embodiment. In FIG. 13, an IDT electrode 53 including two regions 53a and 53b of different wavelengths is provided between reflectors 51 and 52. In this way, as a result of the IDT electrode 53 including the two regions 53a and 53b having different wavelengths, a configuration is realized that is equivalent to a circuit including the single-terminal-pair surface acoustic wave resonator 35 and the second single-terminal-pair surface acoustic wave resonator 36 connected in parallel with the single-terminal-pair surface acoustic wave resonator 35. In this case, reflectors are shared in the second surface acoustic wave resonator 36 and the first surface acoustic wave resonator. Therefore, a further decrease in size is achieved.

In the second preferred embodiment, a single second surface acoustic wave resonator 36 is connected in parallel with the first surface acoustic wave resonator 35, but instead two or more second surface acoustic wave resonators having different resonant frequencies may preferably be connected in parallel with the first surface acoustic wave resonator 35. That is, the number of the plurality of surface acoustic wave resonators connected in parallel may be three or more.

Third Preferred Embodiment

Figure 14:
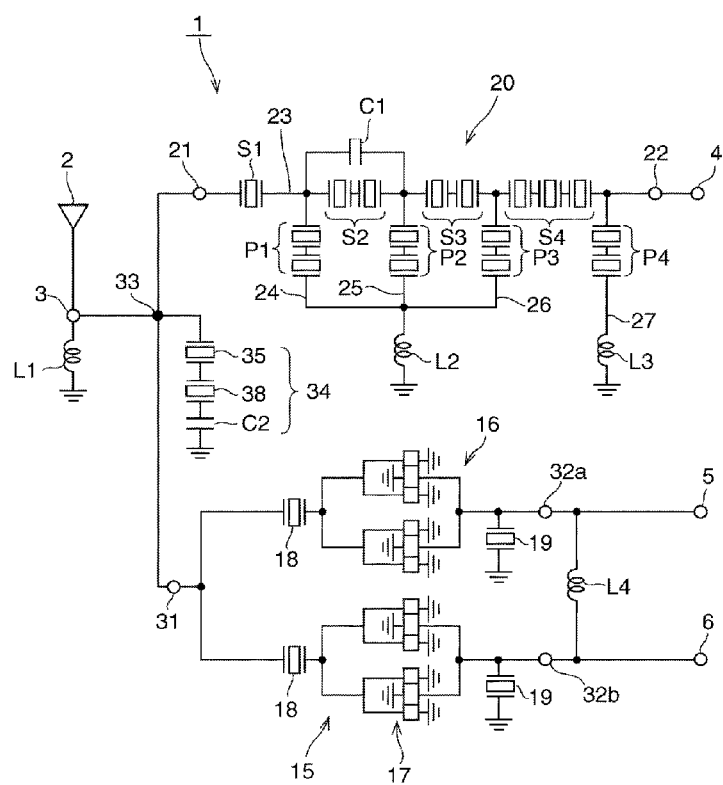
FIG. 14 is a schematic circuit diagram of an elastic wave splitter according to a third preferred embodiment of the present invention.
Figure 15:
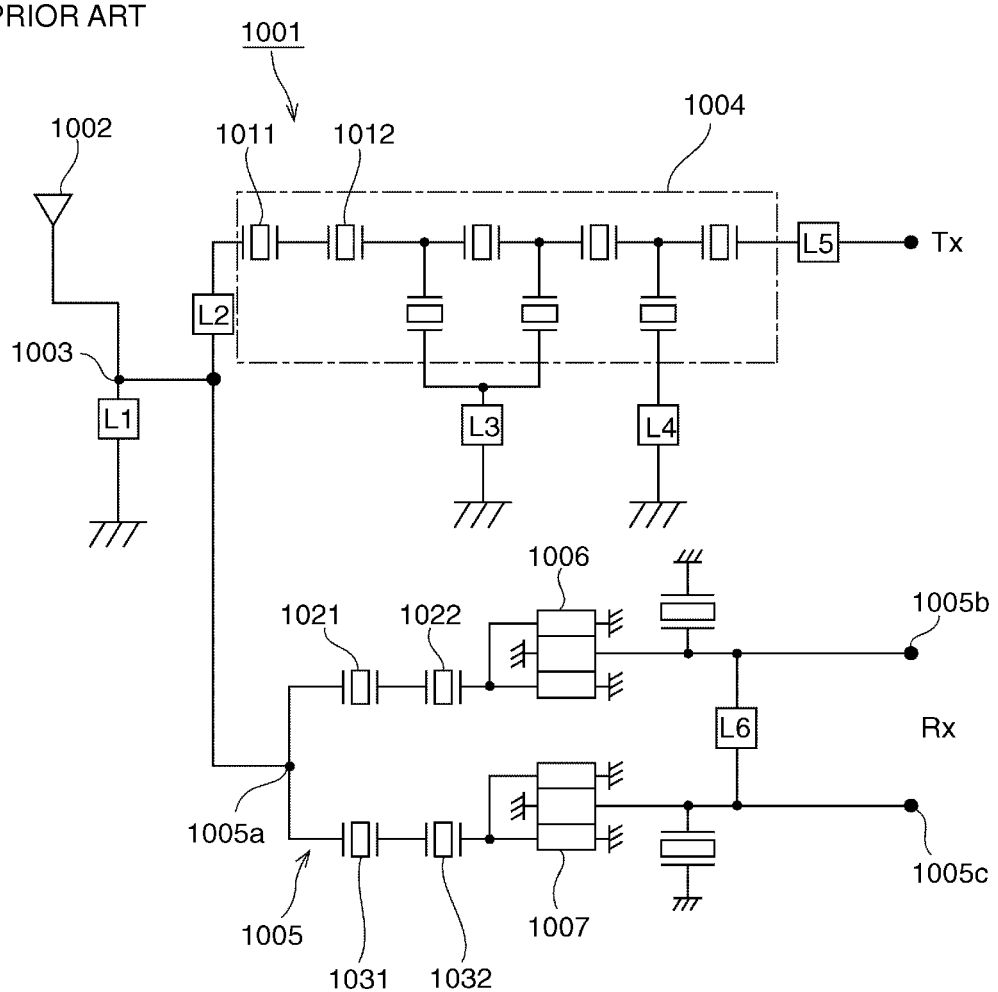
FIG. 15 is a schematic circuit diagram of an elastic wave splitter of the related art.

FIG. 14 is a schematic circuit diagram of an elastic wave splitter according to a third preferred embodiment of the present invention. Elements the same as those in the first preferred embodiment are denoted by the same reference symbols, their description in the first preferred embodiment is to be referred to and detailed description thereof will be omitted.

In this preferred embodiment, a third single-terminal-pair surface acoustic wave resonator 38 is connected in series with the single-terminal-pair surface acoustic wave resonator 35 in the resonant circuit 34. The wavelength of the IDT electrode of the third single-terminal-pair surface acoustic wave resonator 38 is longer than that of the first single-terminal-pair surface acoustic wave resonator 35. That is, the resonant frequency of the third single-terminal-pair surface acoustic wave resonator 38 is positioned farther toward the low-frequency side than the resonant frequency of the first single-terminal-pair surface acoustic wave resonator 35. The rest of the configuration is preferably the same as that of the first preferred embodiment.

In this preferred embodiment, the third single-terminal-pair surface acoustic wave resonator 38, which has a longer IDT electrode wavelength than the single-terminal-pair surface acoustic wave resonator 35, is provided. As a result, two attenuation poles are positioned in the interference wave frequency band. Therefore, the stop bandwidth is broadened. Therefore, according to the present preferred embodiment, interference waves are attenuated over a broader frequency band than in the first preferred embodiment.

In addition, in this preferred embodiment, in the resonant circuit 34, a single third single-terminal-pair surface acoustic wave resonator 38 is connected in series with the first single-terminal-pair surface acoustic wave resonator 35, but instead two or more third single-terminal-pair surface acoustic wave resonators having different resonant frequencies to each other may be connected in series with the first single-terminal-pair surface acoustic wave resonator 35. That is, the number of single-terminal-pair surface acoustic wave resonators connected in series with each other may be three or more.

In addition, the second preferred embodiment and the third preferred embodiment may preferably be combined with each other. That is, the third single-terminal-pair surface acoustic wave resonator 38 may preferably be connected in series with the first surface acoustic resonator 35 and in addition as in the second preferred embodiment at least one second single-terminal-pair surface acoustic wave resonator 36 may preferably be connected. As a result, interference waves are attenuated over a broader frequency band.

In addition, in the first to third preferred embodiments, the resonator that is closest to the antenna terminal side preferably is not divided into a plurality of resonators, but in the present invention a method in which a resonator is divided may preferably be used.

In addition, in the first to third preferred embodiments, the resonant circuit 34 is provided on the transmission filter chip 60 side, but it may be instead provided on the reception filter chip 70 side. That is, the resonant circuit 34 may be provided between the unbalanced input terminal and the ground potential. Normally, the optimal electrode film thickness of the surface acoustic wave resonator is thicker for the filter having the lower frequency band. Therefore, resistive loss is reduced. When resistive loss is reduced, interference waves are even more attenuated due to the reduction in power density and so forth. Consequently, IMD is effectively suppressed or prevented. In addition, loss of the resonant circuit in the pass band of the elastic wave splitter is significantly reduced or prevented and therefore degradation of the insertion loss of the splitter is unlikely to occur. Therefore, in the first to third preferred embodiments, the resonant circuit 34 is provided on the transmission filter chip side, the transmission filter 60 having the lower frequency band. However, in the case of a communication system in which the reception frequency is lower than the transmission frequency, it would be preferable to provide the resonant circuit 34 on the reception filter chip 70 side.

In addition, in FIG. 2, the transmission filter chip 60 and the reception filter chip 70 are respectively provided using the piezoelectric substrates 60a and 70a, but they may instead be provided using a single piezoelectric substrate. That is, the transmission filter 20 and the reception filter 15 may be provided on a single piezoelectric substrate. In such a case, it is likely that there will be a dead space, which is a region that does not contribute to the filter functions, between the reception filter 15 and the transmission filter 20. However, if the resonant circuit 34 is provided between the reception filter and the transmission filter 20, the dead space can be effectively utilized. Therefore, generation of IMD is effectively suppressed or prevented without incurring an increase in piezoelectric substrate size. In addition, it is a simple matter to form the resonant circuit 34 on a single piezoelectric substrate at the same time as one of or both of the reception filter 15 and the transmission filter 20. That is, filter functions and an IMD suppression function can be readily realized on a single piezoelectric substrate without incurring an increase in size. Furthermore, when the elastic wave splitter of this preferred embodiment is used in a communication device, generation of IMD is readily suppressed or prevented without incurring an increase in size of the communication device.

In addition, in the first to third preferred embodiments, an elastic wave splitter that preferably utilizes surface acoustic waves is described, but boundary acoustic waves or bulk acoustic waves (BAW) may be instead used.

While preferred embodiments of the present invention have been described above, it is to be understood that variations and modifications will be apparent to those skilled in the art without departing from the scope and spirit of the present invention. The scope of the present invention, therefore, is to be determined solely by the following claims.

What is claimed is:

1. An elastic wave splitter comprising:
   an antenna terminal;
   a transmission terminal;
   a reception terminal;
   a transmission filter that is connected between the antenna terminal and the transmission terminal and that is defined by an elastic wave filter;
   a reception filter that is connected between the antenna terminal and the reception terminal and that is defined by an elastic wave filter; and
   a resonant circuit that is connected between the antenna terminal and a ground potential and includes an elastic wave resonator and a capacitor connected in series with the elastic wave resonator; wherein
   a resonant frequency of the resonant circuit is positioned in a frequency band of an interference wave that causes intermodulation distortion to be generated;
   the capacitor includes a plurality of comb-tooth electrodes;
   the elastic wave resonator includes a plurality of comb-tooth electrodes; and
   the capacitor and the elastic wave resonator are arranged such that a direction in which the plurality of comb-tooth electrodes of the capacitor extend defines an angle of about 90° with a direction in which the plurality of comb-tooth electrodes of the elastic wave resonator extend.

2. The elastic wave splitter according to claim 1, wherein, when one of a transmission frequency band of the transmission filter and a reception frequency band of the reception filter is F1 to F2 (F2>F1) and the other is R1 to R2 (R2>R1), the resonant frequency of the resonant circuit is positioned in a band of mF1±nR1~mF2±nR2, where m and n are integers.

3. The elastic wave splitter according to claim 2, wherein the resonant frequency of the resonant circuit is positioned in a band of |mF1±nR1|~|mF2±nR2| (0<|m|+|n|≤7).

4. The elastic wave splitter according to claim 3, wherein the resonant frequency of the resonant circuit is positioned in a band |mF1±nR1|~|mF2±nR2| (0<|m|+|n|≤3).

5. The elastic wave splitter according to claim 1, wherein the resonant circuit further includes a second elastic wave resonator connected in parallel with the elastic wave resonator.

6. The elastic wave splitter according to claim 1, wherein the resonant circuit further includes a third elastic wave resonator connected in series with the elastic wave resonator.

7. The elastic wave splitter according to claim 1, wherein the transmission filter is defined by a transmission filter chip that includes a piezoelectric substrate, the reception filter is defined by a reception filter chip that includes a piezoelectric substrate, and the resonant circuit is defined by one of the transmission filter chip and the reception filter chip.

8. The elastic wave splitter according to claim 7, further comprising a wiring board, the transmission filter chip and the reception filter chip being mounted on the wiring board.

9. The elastic wave splitter according to claim 1, wherein the transmission filter is defined by a transmission filter chip, the reception filter is defined by a reception filter chip, and the transmission filter chip and the reception filter chip are integrated with each other and share a single piezoelectric substrate, and the resonant circuit is provided on the single piezoelectric substrate.

10. The elastic wave splitter according to claim 1, wherein the elastic wave splitter is configured to use one of surface acoustic waves, boundary acoustic waves, and bulk acoustic waves.

11. The elastic wave splitter according to claim 1, wherein the elastic wave splitter is a surface acoustic wave duplexer.

12. The elastic wave splitter according to claim 1, wherein the transmission filter includes an output terminal connected to the antenna terminal and an input terminal connected to the transmission terminal, and a series arm arranged to connect the output terminal and the input terminal.

13. The elastic wave splitter according to claim 12, wherein the series arm includes a plurality of series arm resonators connected in series with each other.

14. The elastic wave splitter according to claim 13, wherein each of the series arm resonators is defined by a plurality of single-terminal-pair surface acoustic wave resonators or defined by only one single series arm resonator.

15. The elastic wave splitter according to claim 12, further comprising a plurality of parallel arms provided between the series arm and a ground potential.

16. The elastic wave splitter according to claim 15, wherein each of the parallel arm resonators is defined by a plurality of single-terminal-pair surface acoustic wave resonators or defined by only one single-terminal pair surface acoustic wave resonator.

17. The elastic wave splitter according to claim 1, wherein the resonant circuit further includes a second elastic wave resonator connected in parallel with the elastic wave resonator and a third elastic wave resonator connected in series with the elastic wave resonator.

18. The elastic wave splitter according to claim 17, wherein the second elastic wave resonator includes at least one single-terminal-pair surface acoustic wave resonator and the third elastic wave resonator includes at least one third single-terminal-pair surface acoustic wave resonator.

19. The elastic wave splitter according to claim 1, wherein the transmission filter is defined by a transmission filter chip, the reception filter is defined by a reception filter chip, and the resonant circuit is provided on a transmission filter chip side.

20. The elastic wave splitter according to claim 1, wherein the transmission filter is defined by a transmission filter chip, the reception filter is defined by a reception filter chip, and the resonant circuit is provided on a reception filter chip side.

* * * * *